United States Patent [19]
Bahr et al.

[11] Patent Number: 6,000,054
[45] Date of Patent: Dec. 7, 1999

[54] METHOD AND APPARATUS FOR ENCODING AND DECODING BINARY INFORMATION USING RESTRICTED CODED MODULATION AND PARALLEL CONCATENATED CONVOLUTION CODES

[75] Inventors: Randall Kent Bahr, Scottsdale; Edward Kerry Orcutt, Chandler, both of Ariz.

[73] Assignee: Motorola, Inc., Schaumburg, Ill.

[21] Appl. No.: 08/963,493

[22] Filed: Nov. 3, 1997

[51] Int. Cl.[6] .................................................. G06F 11/10
[52] U.S. Cl. .......................................................... 714/786
[58] Field of Search .................................... 714/786, 787, 714/788, 789, 790, 791, 793, 794, 795, 746, 752

[56] References Cited

U.S. PATENT DOCUMENTS

| | | | |
|---|---|---|---|
| 5,146,475 | 9/1992 | Kubo | 375/341 |
| 5,177,480 | 1/1993 | Clark | 341/51 |
| 5,381,425 | 1/1995 | Bitzer et al. | 714/787 |
| 5,430,743 | 7/1995 | Monturano et al. | 379/75 |
| 5,440,588 | 8/1995 | Murakami | 375/341 |
| 5,509,020 | 4/1996 | Iwakiri et al. | 375/341 |
| 5,608,737 | 3/1997 | Kimura et al. | 341/107 |

(List continued on next page.)

OTHER PUBLICATIONS

Unequal Error Protection Using Convolutional Codes, R. Brissett, J. Sodha; Communications, 1994. ICC '94, Supercomm/ICC '94, Conference Record, 'Serving Humanity Through Communications.' IEEE International Conference on , pp. 1789–1794 vol. 3.

Systematic encoders for convolutional codes and their application to turbo codes; Benedetto, S.; Garello, R.; Montorsi, G.; Global Telecommunications Conference, 1996. Globecom '96. Communications: The Key to Global Prosperity , pp. 6–10.

Design guidelines of parallel concatenated convolutional codes; Benedetto, S.; Montorsi, G.; Global Telecommunications Conference, 1995. Globecom '95., IEEE vol. 3 , pp. 2273–2277 vol.3.

Design of parallel concatenated convolutional codes; Benedetto, S.; Montorsi, G.; Communications, IEEE Transactions on; vol. 44 5, 1996 , pp. 591–600.

Concatenated coding for binary partial–response channels , Cherubini, G.; Olcer, S., Communications, 1994. ICC '94, Supercomm/ICC '94, Conference Record, 'Serving Humanity Through Communications.', IEEE International Conference on , pp. 1789–1794 v.

L.R. Bahl, J. Cocke, F. Jelinek, J. Raviv, "Optimal Decoding of Linear Codes for Minimizing Symbol Error Rate", IEEE Transactions On Information Theory, vol. IT–20, Mar. 1974, pp. 284–287.

C. Berrou, A. Glavieux, P. Thitimajshima, "Near Shannon Limit Error—Correcting Coding And Decoding: Turbo–Codes (1)", Proceeding of ICC 1993, May 1993, pp. 1064–1070.

P. Robertson, "Illuminating the Structure of Code and Decoder of Parallel Concatenated Recursive Systematic (Turbo) Codes", Proceedings of IEEE Globecom 1994, pp. 1298–1303.

*Primary Examiner*—Albert De Cady
*Assistant Examiner*—Jason Greene
*Attorney, Agent, or Firm*—Sherry J. Whitney; Frank J. Bogacz

[57] ABSTRACT

A restricted coded modulator apparatus (100, FIG. 1) is used to assign binary digits to symbols such that an error in one or more binary digits in an M-ary modulation format are the most likely. A parallel concatenated convolutional code is then applied to one or more digits of the symbol before transmitting the symbols across a communications channel (190, FIG. 1). At the receiving end, the one or more binary digits of the symbols and the associated error correction information are decoded by way of a parallel concatenated convolutional decoder (200, FIG. 4). The corrected information is then used to correct errors in other binary digits of the received symbol.

14 Claims, 4 Drawing Sheets

U.S. PATENT DOCUMENTS

| | | | |
|---|---|---|---|
| 5,642,368 | 6/1997 | Gerson et al. | 704/200 |
| 5,657,333 | 8/1997 | Ikekawa | 714/794 |
| 5,666,370 | 9/1997 | Ganesan et al. | 375/286 |
| 5,721,745 | 2/1998 | Hladik et al. | 714/786 |
| 5,734,962 | 3/1998 | Hladik et al. | 455/12.1 |
| 5,867,109 | 2/1999 | Wiedman | 340/827 |
| 5,870,405 | 2/1999 | Hardwick et al. | 714/701 |

METHOD AND APPARATUS FOR ENCODING AND DECODING BINARY INFORMATION USING RESTRICTED CODED MODULATION AND PARALLEL CONCATENATED CONVOLUTION CODES

License Rights: The U.S. Government has a paid-up license in this invention and the right, in limited circumstances, to require the patent owner to license others on reasonable terms.

FIELD OF THE INVENTION

This invention relates to the field of digital communication and, more particularly, to the error control coding and decoding of binary information.

BACKGROUND OF THE INVENTION

In a digital communication system, binary information is conveyed from one device to another through a variety of channels and recovered at a receiving end. The electronics which receive the binary information also receive varying amounts of noise and distortion which degrade the quality of the signal. This can be the result of a variety of physical phenomena, such as interference from adjacent similar transmitters or receivers, thermal noise present in the receiving device electronics, meteorological phenomena, or numerous other sources. In most communication systems, provisions are made to minimize the impact of degradations on the received signal.

There are several approaches taken to minimize the effect of noise present in a received signal. A typical approach is to increase the power of the transmitter. This increases the ratio of the received signal strength relative to the noise present at the receiving end. Though effective, this technique increases the resources needed at the transmitting end of the communication system. In some communication systems, an increase in required transmitter power can vastly increase the cost of operating the system.

Another approach toward minimizing the effects noise and distortions present in a received signal is to decrease the rate at which information is conveyed from the transmitter to the receiver. This is effective since it increases the time allotted to the receiver to make a decision as to the state of each binary digit. This technique has the obvious disadvantage of reducing the speed of the information transfer within the communication system.

A better technique of minimizing the effect of noise and distortions present at the receiving end is to encode the binary information at the transmitter using an error control code. Through the use of an error control code, the transmitted information is encoded through the addition of error control information according to various techniques in order to become more resistant to the effects of noise. At the receiver, these error control binary digits are manipulated in order to correct errors in the information binary digits. Generally, the more error control binary digits that are added at the transmitter, the more robust the error correction capability of the error control code and therefore the more resistant the code is to the effects of noise at the receiving end of the communication system. However, as error control binary digits are added, they consume a larger and larger percentage of the available channel bandwidth.

A disadvantage of many error control codes is that although they provide acceptable performance in moderate noise environments, they are incapable of performing in severe noise environments. In these environments, a larger and larger percentage of the available bandwidth is consumed by the error control binary digits. Convolutional error control codes provide satisfactory operation in moderate noise environments without consuming a large amount of channel bandwidth. In more severe noise environments, concatenating more than one convolutional error control code and arranging the encoders along parallel data paths can improve performance. However, these techniques require significant channel bandwidth to be effective due to the additional error control binary digits added by the concatenated convolutional code.

Therefore, what is needed is a method and apparatus for encoding and decoding binary information using a highly noise resistant code that will consume only a small portion of the channel bandwidth.

DETAILED DESCRIPTION OF THE DRAWINGS

The method and apparatus of the present invention combines the technique of restricted coded modulation with a parallel concatenated convolutional code to encode information binary digits while consuming only a small portion of the channel information bandwidth. In accordance with a preferred embodiment of the invention, each of the information binary digits which comprise the stream of binary digits are grouped into symbols. The assignment of binary digits to symbols is made such that the most likely errors, adjacent symbol errors, correspond to errors in a specific subset of the binary digits which comprise the symbol. In this manner, the most likely errors in the symbol are manifested into errors in a specific subset of the binary digits which comprise the symbol. A parallel concatenated convolutional code is applied to the specific subset of binary digits to produce an encoded stream of binary digits. The encoded stream of binary digits is then combined with the unencoded binary digits of the symbol and transmitted along the communication channel. At the receiving end, the encoded binary digits are then decoded to correct any noise-induced adjacent symbol errors which may corrupt either the information or the error control binary digits. The corrected information is then used to correct errors in the unencoded binary digits which comprise the symbol.

Restricted Coded Modulation

Restricted Coded Modulation is performed under the assumption that, in a higher order modulation format, adjacent symbol errors are statistically more likely to occur than other types of errors. In a higher order modulation format, the transmitted symbol has more than two states. In the example used herein, in subsequent paragraphs, an 8-ary modulation format is used. In the example, the binary digit to symbol assignments are made in a manner such that the binary digit representation of each adjacent symbol differs in a designated binary digit position and, in some cases, other binary digit positions as well. Thus, through the correction of the single binary digit, the value of the entire symbol can be corrected.

Figure 1:
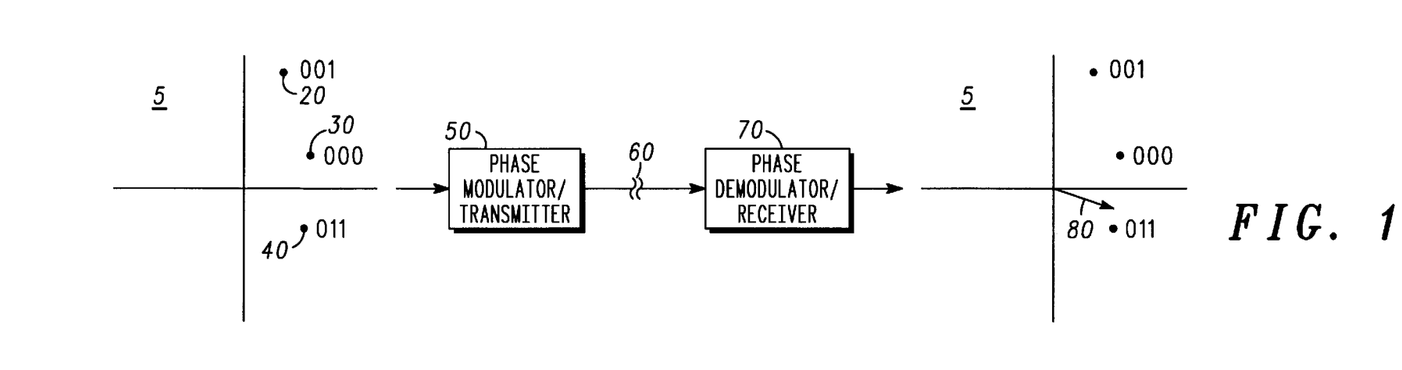
FIG. 1 illustrates an example of symbol correction using restricted coded modulation in accordance with a preferred embodiment of the present invention.

FIG. 1 illustrates an example of symbol correction using restricted coded modulation in accordance with a preferred embodiment of the present invention. In FIG. 1, Euclidean 8-ary signal space 5 is used as an illustrative example of restricted coded modulation, although any higher order modulation format can be used as well. The only requirement of the higher order modulation format is that the assignment of binary digits to symbols results in a symbol having more than two states.

In FIG. 1, the binary digit to symbol assignments are desirably made in a manner such that the binary digit representation of adjacent symbols differ in the least significant binary digit. These assignments can be made such that adjacent symbols differ in a binary digit in any location in the representation of the symbol, such as the most significant binary digit. Each symbol can differ in other bit positions as well, but, in all cases, differ in a designated binary digit position, such as the least significant binary digit, as in FIG. 1.

In FIG. 1, point 20 has been assigned the binary digit representation of 001. Similarly, point 30 has been assigned the binary digit representation of 000, and point 40 has been assigned the binary digit representation of 011. The binary digit assignments of the remaining points, which represent the remaining allowable symbols of Euclidean 8-ary signal space 5, are not important to this illustrative example.

In FIG. 1, binary digits 000, which represents point 30, are modulated through phase modulator/transmitter 50. After the phase information is modulated, the transmitter portion of phase modulator/transmitter 50 transmits the phase information through communication channel 60 by any technique. Although phase modulation is chosen as the technique by which information is impressed on a carrier signal, any of several modulation techniques can be used, such as frequency, amplitude, or combinations. The only requirement of phase modulator/transmitter 50 is that it is capable of modulating and transmitting a higher order format, such as the 8-ary format described herein.

Communication channel 60 can be comprised of any transmission medium such as free space or air, for use with wireless communication systems, or through a conductor, such as in a telephone system. The only requirement of communication channel 60 is that it be capable of conveying the binary information at the symbol rate of phase modulator/transmitter 50.

As the information is conveyed through communication channel 60, the signal decreases in strength. This decrease in signal strength may be the result of ohmic losses in the conductive medium, propagation loss due to the spreading of radiated energy transmitted through air or free space, or other loss mechanism known to those of skill in the art. Additionally, at the receiving end of communication channel 60, the electronics which comprise phase demodulator/receiver 70 may generate thermal noise, or may otherwise receive energy from unwanted sources in sufficient quantity so as to erroneously estimate the received signal as that which corresponds to a value other than 000. In this example, the presence of noise at the receiving end of the communication system causes phase demodulator/receiver 70 to interpret the received signal as phase vector 80. This causes phase demodulator/receiver 70 to assign the binary digits of 011 to the received signal.

The reception of phase vector 80 and the subsequent assignment of phase vector 80 to binary digits 011 by receiver/demodulator 70 is an example of the most likely type of error in higher order modulation formats such as that of Euclidean 8-ary signal space 5. Therefore, through the error correction of a single binary digit which comprises the received symbol, in this case the least significant binary digit, the entire symbol can be corrected. In this example, if an error control code of any type were to be applied to the least significant binary digit, then the binary digit could be correctly interpreted as a binary 0. Additionally, the symbol closest to phase vector 80 having a binary digit to symbol assignment with a 0 in the position of the least significant binary digit position corresponds to 000 in Euclidean signal space 5. Thus, this example shows that the correction of a single binary digit, in this case the least significant binary digit, results in the correction of the entire symbol.

In accordance with the present invention, restricted coded modulation could be applied to correct the symbol by correcting a single binary digit. Restricted coded modulation can be applied to modulation formats in which adjacent symbols differ in two binary digits as well as one. Thus, the use of restricted coded modulation in accordance with the method and apparatus of the present invention can be applied to modulation formats where the error control coding of two or more of the binary digits which comprise the symbol results in correction of the entire symbol. Thus, restricted coded modulation encompasses modulation techniques in which an entire symbol is corrected based on the correction of a subset of the binary digits which comprise the symbol.

Figure 2:
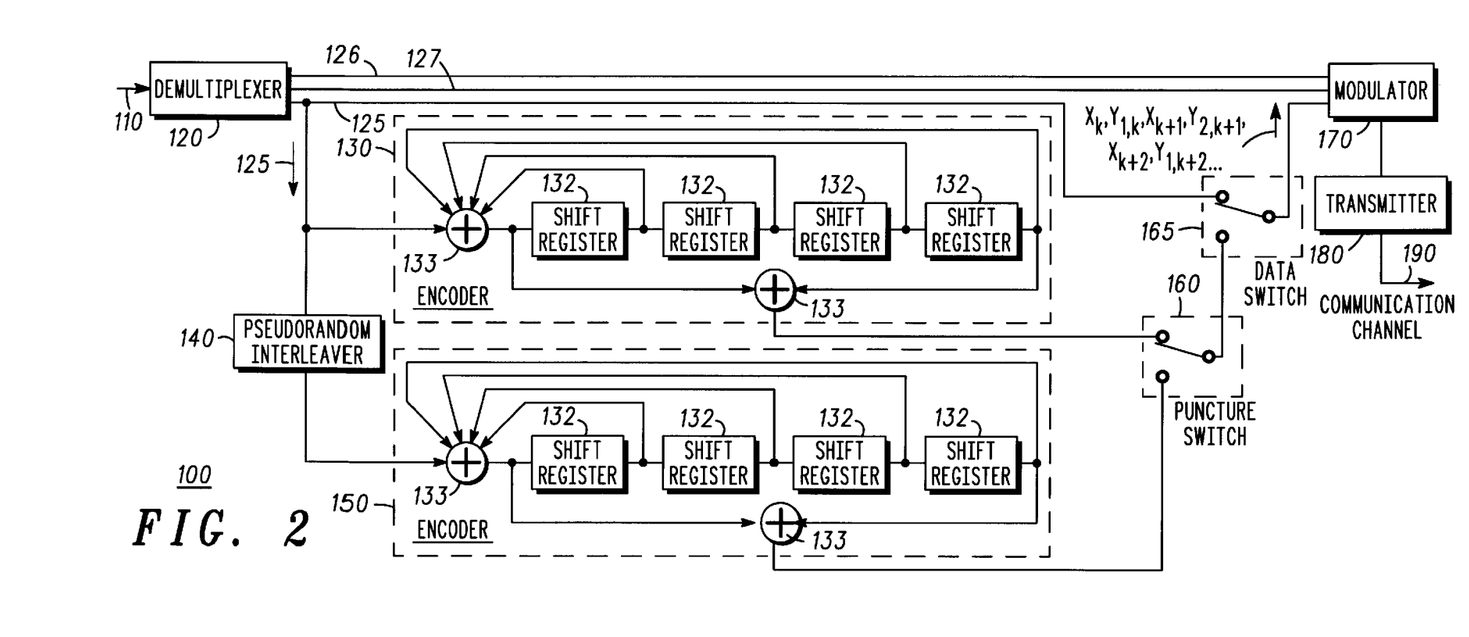
FIG. 2 illustrates a block diagram of an apparatus for encoding bins information using restricted coded modulation and parallel concatenated convolutional codes in accordance with a preferred embodiment of the present invention.

Parallel Concatenated Convolutional Encoding of Restricted Coded Modulated Streams of Binary Digits FIG. 2 illustrates a block diagram 100 of an apparatus for encoding binary information using restricted coded modulation and parallel concatenated convolutional codes in accordance with a preferred embodiment of the present invention. FIG. 2 can comprise the electronics suite of a satellite space vehicle, such as a communications satellite, or can comprise the electronics suite of a terrestrial based system. FIG. 2 can also comprise the electronics suite of a portable communications system which transmits voice or data, or a combination of either, such as a cellular telephone, data fax machine, or computer unit.

In FIG. 2, an unencoded stream of binary digits 110 is first converted from unencoded stream of binary digits 110 to several unencoded streams of binary digits, 125, 126, and 127, by way of demultiplexer 120. Demultiplexer 120 can convert unencoded stream of binary digits 110 into any number of unencoded streams according to the modulation format used to assign binary digits to symbols. For example, in an 8-ary modulation format, demultiplexer 120 can convert unencoded stream of binary digits 110 into three unencoded streams of binary digits. In a 16-ary modulation format, demultiplexer 120 can convert unencoded stream of binary digits 110 into four unencoded streams of binary digits. The only requirements of demultiplexer 120 are that it possess the number of outputs suited for the modulation format to be used, such as three outputs for an 8-ary format, and be capable of converting unencoded stream of binary digits 110 to multiple streams of binary digits at a rate compatible with the data rate of unencoded stream of binary digits 110. Demultiplexers which are capable of converting streams of binary digits to multiple streams of binary digits, at various data rates, are known to those skilled in the art.

Unencoded stream of binary digits 125 from demultiplexer 120 is fed to recursive convolutional encoder 130. Recursive convolutional encoder 130 performs an important step in transforming unencoded stream of binary digits 125 into a convolutionally encoded stream of binary digits.

Unencoded stream of binary digits 125 is also fed to pseudorandom interleaver 140 as shown in FIG. 2. Pseudorandom interleaver 140 reads in unencoded stream of binary digits 125 and rearranges the relative position of each binary digit on a pseudorandom basis. Through this pseudorandom interleaving, the Hamming distance between allowable code words which comprise the parallel concatenated convolutional code space is increased. Pseudorandom interleavers of this type are known to those skilled in the art.

The output of pseudorandom interleaver 140 is then fed to recursive convolutional encoder 150. Recursive convolutional encoder 150 acts on the interleaved stream of binary digits in a manner similar to that performed by recursive convolutional encoder 130 on unencoded stream of binary digits 125.

The resulting convolutionally encoded stream of binary digits then becomes more noise resistant due to the additional error control information binary digits added to unencoded stream of binary digits 125. Recursive convolutional encoders such as 130 are well known to those skilled in the art.

Although recursive convolutional encoder 130 is shown as possessing four shift registers such as 132, there is no restriction on the number of shift registers used. Similarly, recursive convolutional encoder 150 is also shown as possessing four shift registers, although there is no restriction on the number of shift registers used in recursive convolutional encoder 150 either. The only requirements of recursive convolutional encoders 130 and 150 is that each is capable of generating a useful code which, when used in any communication system, would provide some useful level of error control coding. Those skilled in the art are familiar with the number of shift registers and the arrangement of the binary adders, such as 133, needed to produce a recursive convolutional encoder that provides acceptable error control performance.

The outputs of recursive convolutional encoders 130 and 150 are coupled to puncture switch 160. Puncture switch 160 serves to switch the outputs from recursive convolutional encoders 130 and 150 so that one binary digit from each is present at the input to data switch 165. Thus, puncture switch 160 is first in contact with the output of recursive convolutional encoder 130, sending one binary digit to the input of data switch 165, and is then in contact with recursive convolutional encoder 130, sending a binary digit from that encoder to the input of data switch 165. Data switch 165 then switches between unencoded stream of binary digits 125 and the output of puncture switch 160.

The method and apparatus of the present invention is not limited to strictly requiring puncture 160. Puncture switch 160 is optional in that it serves only to adjust the code rate from one-third to one-half. The rationale for the inclusion of puncture switch 160 is that a punctured rate one-half parallel concatenated convolutional code provides a more noise resistant code than an ordinary rate one-half convolutional code. Thus, the resulting convolutionally encoded stream of binary digits from switch 165 becomes highly noise resistant due to the additional error control information binary digits added to unencoded stream of binary digits 125 by recursive convolutional encoders 130 and 150, pseudorandom interleaver 140, and optional puncture switch 160. Additionally, the removal of puncture switch 160 will result in an parallel concatenated convolutional code which requires more bandwidth but also provides more error control capability.

Through the action of data switch 165, and puncture switch 160, binary digits from stream of unencoded binary digits 125 are forwarded to modulator 170 exactly one-half of the time. During the other one-half of the time, the outputs of recursive convolutional encoders 130 and 150 each provide a single binary digit to modulator 170. Both data switch 160 and 165 are switched at the twice the data rate of stream of unencoded binary digits 125. Thus, the binary digit sequence at the input to modulator 170 appears as $X_k$, $Y_{1,k}$, $X_{k+1}$, $Y_{2,k+1}$, $X_{k+2}$, $Y_{1,k+2}$, and so forth. Values of the binary digits which comprise stream of unencoded binary digits 125 are denoted by $X_k$, $X_{k+1}$, and the like, while values from the outputs of recursive convolutional encoders 130 and 150 are denoted as denoted by $Y_k$, $Y_{k+1}$, etc., and $Y_{2,k}$, $Y_{2,k+1}$, etc., respectively.

In this example, recursive convolutional encoders 130 and 150 as well as pseudorandom interleaver 140 and switches 160 and 165, are shown acting on unencoded stream of binary digits 125 which, in a preferred embodiment, represent the least significant binary digits of the unencoded stream of binary digits 110. However, as is the case with restricted coded modulation using any type of error control coding, the method and apparatus of the present invention is not limited to error control coding of the least significant binary digit. The aforementioned aggregate of switches 160 and 165, recursive convolutional encoders 130 and 150, and pseudorandom interleaver 140, could have been arranged so as to perform the parallel concatenated convolutional encoding on any one or more of the streams of binary digits from demultiplexer 120, such as 126, or 127.

The output of data switch 165 is combined with unencoded streams of binary digits 126, and 127. In modulator 170, the streams are combined and modulated. Modulator 170 receives the incoming streams of binary digits and performs modulation according to standard techniques. Modulator 170 can convert the streams of binary digits to distinct frequencies, as in a frequency modulation communication system, or may convert the streams of binary digits to discrete phases, as in a phase shift keying system. Modulator 170 can also apply an additional chipping code to the modulated signal, such as in a code division multiple access system, or impose timing constraints, such as in a time domain multiple access system, or can perform a combination of both. The only requirements of modulator 170 is that the modulator accept the streams of binary digits and make use of the symbol information to modulate a signal according to the chosen modulation technique.

The output of modulator 170 is coupled to transmitter 180. Transmitter 180 provides the mechanism by which the signal from modulator 170 is conveyed to channel 190. Transmitter 180 can perform radio frequency signal amplification, as in a radio frequency based communication system, or may convert the output of modulator 170 to optical information, as in an optical based communication system. Alternatively, transmitter 180 may only perform signal conditioning to enable the output of modulator 170 to be transmitted at baseband through a conductor.

Thus, through the use of the method and apparatus of this invention, a highly noise resistant code for transmitting binary information can be generated. This has the potential of replacing high power transmitter systems with lower cost, lower power, transmitters with only a small sacrifice in channel bandwidth.

Communication channel 190 can be of any type used in any communication system. In a space-based communication system, communication channel 190 can be comprised of free-space. In a terrestrial-based communication system, communication channel 190 may be comprised primarily of air, or a conductive medium such as a coaxial cable. The only requirement of communication channel 190 is that it possess the necessary physical properties to permit a signal to be conveyed from transmitter 190 to a receiver of any type.

Figure 3:
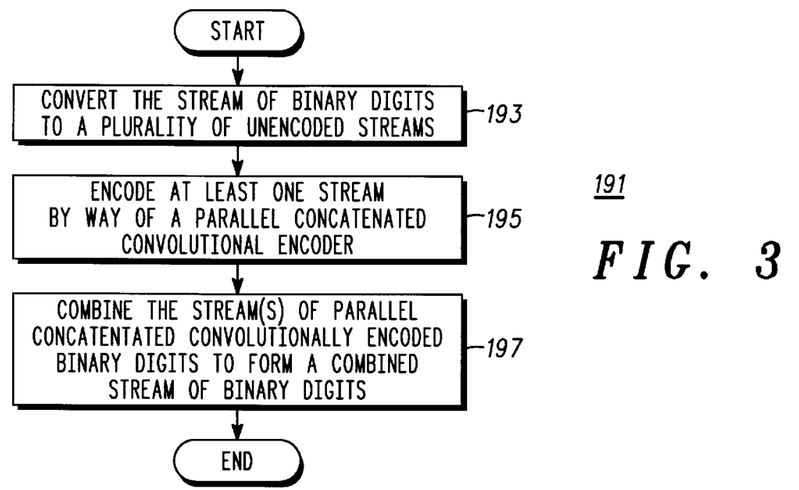
FIG. 3 illustrates a method for applying an error control code to a stream binary digits in accordance with a preferred embodiment.

FIG. 3 illustrates a method 191 for applying an error control code to a stream of binary digits in accordance with a preferred embodiment. Step 193 converts the stream of binary digits to a plurality of unencoded streams of binary digits. Step 195 encodes at least one of the plurality of unencoded streams of binary digits by way of a parallel concatenated convolutional encoder. Step 197 combines the stream(s) of parallel concatenated convolutionally encoded binary digits with the unencoded streams of binary digits resulting in a combined stream of binary digits.

Figure 4:
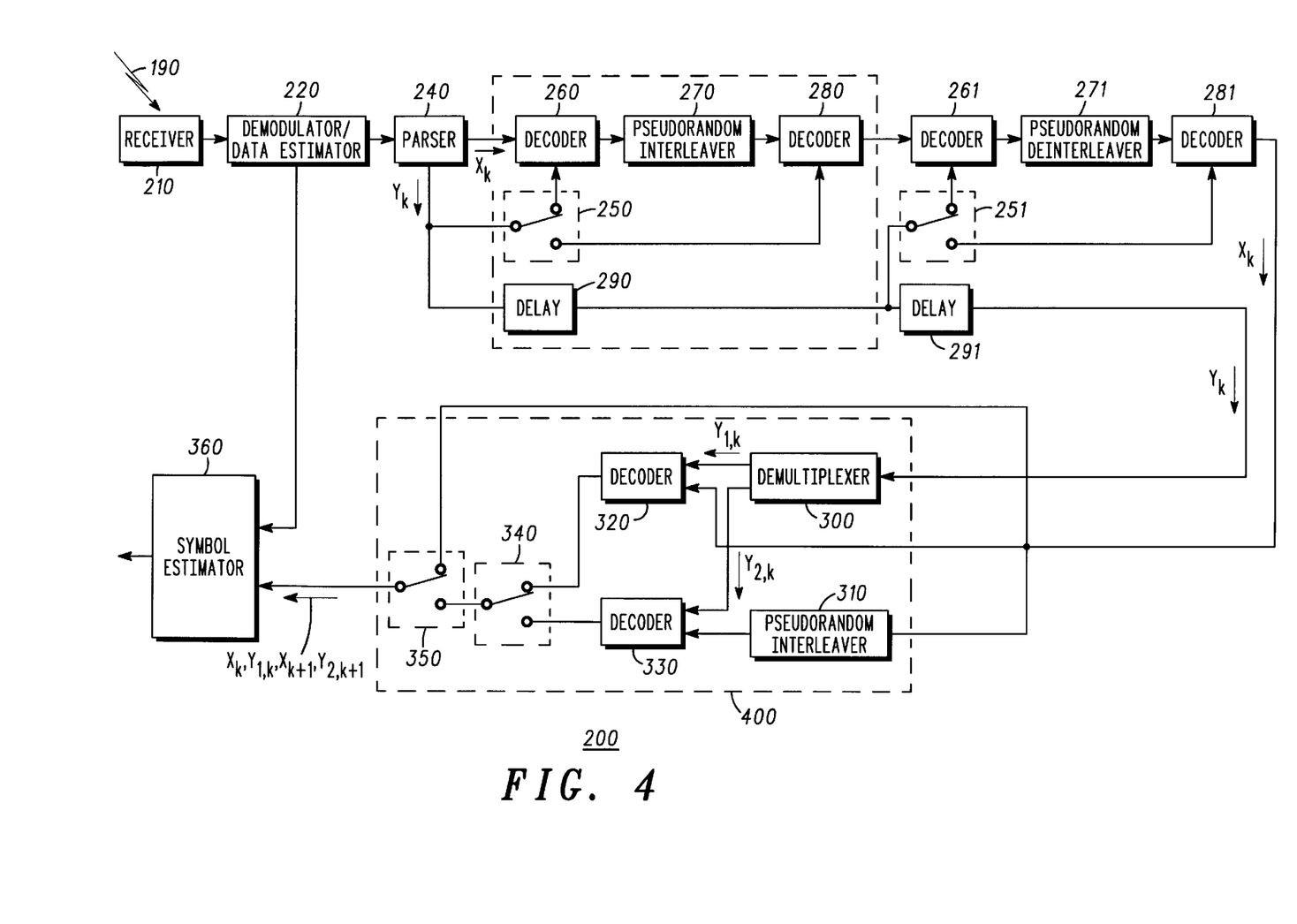
FIG. 4 illustrates a block diagram of an apparatus for decoding binary information using restricted coded modulation and parallel concatenated convolutional codes in accordance with a preferred embodiment of the present invention.

FIG. 4 illustrates a block diagram of apparatus 200 for decoding binary information using restricted coded modulation and parallel concatenated convolutional codes in accordance with a preferred embodiment of the present invention. In FIG. 4, the signal from communication channel 190 is first incident on receiver 210. Receiver 210 can be of any type. The only requirement of receiver 210 is that it be capable of receiving the signal from communication channel 190 and converting the signal into a form recognized by demodulator/data estimator 220.

Demodulator/data estimator 220 converts the signal information from receiver 210 into a stream of estimates of the symbol information conveyed through communications channel 190. Given that the signal information has, most likely, been subjected to degradations while being conveyed through communications channel 190, the estimates of the symbol information may be based on degraded inputs. These degraded inputs are forwarded to symbol estimator 360, to be discussed later.

The requirements of demodulator/data estimator 220 are that it is capable of decoding the signal information from receiver 210 at a rate compatible with the output of receiver 210, and that it be capable of conveying signal information with resolution corresponding to one binary digit greater than the M-ary modulation form used. In the example of FIG. 4, where an 8-ary modulation format is used, demodulator/data estimator 220 possesses at least four binary digit resolution which implies sixteen level quantization. An additional requirement of demodulator/data estimator 220 is that it outputs at least one stream of binary digits corresponding to estimates of a specific binary digit position from each received symbol in accordance with the binary digit encoded by the apparatus described in FIG. 2. In the example of FIG. 2, this corresponds to the least significant binary digit position. However, if another binary digit position had been encoded by the encoder of FIG. 2, then demodulator/data estimator 220 should output a stream of estimates of binary digits in the corresponding position.

In this example, and in a preferred embodiment, the stream of estimates of binary digits from demodulator/data estimator 220 is then input to parser 240. Parser 240 separates the estimates of the least significant binary digits of the symbol from demodulator/data estimator 220 into estimates of error control binary digits, denoted by $Y_k$, and a stream of estimates of message information binary digits, denoted by $X_k$. The stream of estimates of message information binary digits is then fed to the input of decoder 260, while the stream of estimates of error control binary digits is fed to data switch 250.

Data switch 250 controls the second input to decoders 260 and 280. Data switch 250 switches so that alternate estimates of binary digits, denoted by $Y_{1,k}$ and $Y_{2,K}$, are presented to decoders 260 and 280, respectively.

In a preferred embodiment, decoders 260 and 280 perform processing to determine the maximum a posterori estimate of the actual values of the message information binary digits, denoted by $\{c_k\}_{k=1}^{N} = c_1^N$. In a preferred embodiment, the maximum a posterori estimate computes a log likelihood ratio (LLR) which is the logarithm of the ratio of probability that $c_k$ is a binary one conditioned upon the noisy estimates of the message information binary digits and the noisy estimates of the error control binary digits, and the probability that $c_k$ is zero based on the same estimates. The message information binary digits are assumed to be equally likely. Thus, the log likelihood ratio for $c_k$, expressed as $\Lambda(c_k)$, becomes:

$$\Lambda(c_k) = \frac{P(c_k = 1 \mid Y_1^N, X_1^N)}{P(c_k = 0 \mid Y_1^N, X_1^N)} \quad (1a)$$

$$= \frac{P(Y_1^N, X_1^N \mid c_k = 1)}{P(Y_1^N, X_1^N \mid c_k = 0)} \quad (1b)$$

The estimate of $c_k$, denoted $\hat{c}_k$, is derived from $\Lambda(c_k)$ by setting $\hat{c}_k=1$ if $\Lambda(c_k) \geq 0$ and $\hat{c}_k=0$ if $\Lambda(c_k)<0$.

In a preferred embodiment, decoder 260 and 280 calculate $\Lambda(c_k)$ by way of the Bahl-Cooke-Jelinek-Raviv (BCJR) algorithm. This is a recursive technique that proceeds by expressing $\Lambda(c_k)$ in terms of quantities $\{\alpha_k(m)\}_{k=1}^N$ and $\{\beta_k(m)\}_{k=1}^N$ which are computed recursively. Specifically, $$\Lambda(c_k) = \log \frac{\sum_m \sum_{m'} \gamma_1(\vec{R}_k, m, m') \cdot \alpha_{k-1}(m') \cdot \beta_k(m)}{\sum_m \sum_{m'} \gamma_0(\vec{R}_k, m, m') \cdot \alpha_{k-1}(m') \cdot \beta_k(m)} \quad (2)$$

where $$\alpha_k(m) = \sum_{m'} \sum_i \gamma_i(\vec{R}_k, m, m') \cdot \alpha_{k-1}(m') \quad (3a)$$

and $$\alpha_k(m) = \sum_{m'} \sum_i \gamma_i(\vec{R}_{k+1}, m', m) \cdot \beta_{k-1}(m'). \quad (3b)$$

Where $\vec{R}_k$ is the vector of estimates of the information binary digits and the error control binary digits $(X_k, Y_k)$. Where $X_1^N$ and $Y_1^N$ are the noisy estimates of the message information binary digit and the error control binary digits, respectively.

The variable m ranges over the states of the recursive convolutional encoder 130 and 150 (FIG. 2) comprising the parallel concatenated convolutional code encoders in FIG. 2. For the case of recursive convolutional encoder 130 and desirably 150, a sixteen state encoder, m=0,1, . . . ,15. However, the method and apparatus of the present invention is not limited to the use of a sixteen state recursive convolutional encoder, such as 130 and 150. The quantities $\{\gamma_i(\vec{R}_k,m,m')\}$ describe the state transition structure of recursive convolutional encoders 130 and 150 and the probability density functions of the noise present in communication channel 190. The specific form for $\{\gamma_i(\vec{R}_k,m,m')\}$ is expressed as $$\gamma_i(\vec{R}_k,m,m') = P(\vec{R}_k|c_k=i,S_k=m,S_{k-1}=m') \cdot P(c_k=i,S_{k-1}=m'|S_k=m) \quad (4)$$

where $S_k$ is the state of the recursive convolutional encoders 130 and 150 at time k and $S_{k-1}$ is the state as time k-1. $P(c_k=i,S_{k-1}=m'|S_k=m)$ defines the trellis structure for the recursive convolutional encoder 130 and 150. Specifically, $P(c_k=i,S_{k-1}=m'|S_k=m)$ is the probability that a state transition m'→m outputs the binary digit $c_k$ from recursive convolutional encoder 130 and 150. Given a fixed present state m, only two values of $P(c_k=i,S_{k-1}=m'S_k=m)$ will be non-zero. $p(\vec{R}_k|c_k=i,S_k=m,S_{k-1}=m')$ specifies the probability density function of the estimates based upon recursive convolutional encoder 130 and 150 states. Since $X_1^N$ and $Y_1^N$ are independent, it follows that, $$P(\vec{R}_k|c_k=i,S_k=m,S_{k-1}m') \quad (5a)$$

$$= P(X_1^N,Y_1^N|c_k=i,S_k=m,S_{k-1}=m') \quad (5b)$$

$$= P(X_1^N|c_k=i,S_k=m,S_{k-1}=m') \cdot P(Y_1^N|c_k=i,S_k=m,S_{k-1}=m') \quad (5c)$$

Note that $P(\vec{R}_k|c_k=i,S_k=m,S_{k-1}=m')$ exists only for valid recursive convolutional encoder 130 and 150 transitions defined by $P(c_k=i,S_{k-1}=m'|S_k=m)$. To specify (5c), let $\tilde{u}_k(c_k)$ designate the input to recursive convolutional encoder 130 and 150 that elicits output $c_k$ under state transition m'→m. $X_k$ obeys a Gaussian distribution, thus $$p(X_k | c_k = i, S_k = m, S_{k-1} = m') = \frac{1}{\sqrt{2\pi}\,\sigma_X}\exp\left(-\frac{(X_k - \tilde{u}(c_k))^2}{2\sigma_X^2}\right) \quad (6)$$

where $\sigma_x^2$ is the variance of noise, $N_1$, and, assuming additive white Gaussian channel noise, $$p(Y_k | c_k = i, S_k = m, S_{k-1} = m') = \frac{1}{\sqrt{2\pi}\,\sigma_c}\exp\left(-\frac{(Y_k - c_k)^2}{2\sigma_c^2}\right) \quad (7)$$

where $\sigma_c^2$ is the channel noise $N_2$ variance. $p(\vec{R}_k|c_k=i,S_k=m,S_{k-1}=m')$ may be simplified since similar quantities will be present as a ratio in the final LLR. Thus, $$p(\vec{R}_k | c_k, S_k = m, S_{k-1} = m') = \exp\left(\frac{u_k(c_k)\cdot X_k}{\sigma_X^2} + \frac{Y_k \cdot c_k}{\sigma_c^2}\right). \quad (8)$$

The observation $X_k$ is the estimate provided by decoder 260 and $Y_k$ is the received error control binary digit.

In a preferred embodiment, the LLR calculation is performed in decoder 260 as well as decoder 280. Thus, the requirements of decoders 260 and 280 are that each possess the necessary computing capability so as to perform the LLR calculations at a data rate sufficient to process estimates of message information binary digits and estimates of error control binary digits, from demodulator/data estimator 220.

The output of decoder 260 is coupled to pseudorandom deinterleaver 270. Pseudorandom deinterleaver 270 functions to rearrange the estimated values of $X_k$, the message information binary digits, so that each can arrive at decoder 280 concurrent with the associated error control binary digit $Y_{2,K}$. In other words, the effect of deinterleaver 270 is to perform the inverse of the operation performed by pseudorandom interleaver 140 (FIG. 2).

As previously mentioned, decoder 280 performs the identical operations as decoder 260. The only difference is that decoder 260 operates on the estimated values of $X_k$, using inputs of $X_k$ and $Y_{1,k}$, while decoder 280 acts on the estimated values of $X_k$, using inputs of $X_k$ and $Y_{2,k}$. Both decoders 260 and 280 produce estimated values of $X_k$.

The input to switch 250 is also fed to switch 251 through delay line 290. This allows the identical stream of error control binary digits, $Y_k$, to be fed to decoder 261 and pseudorandom deinterleaver 271 through switch 251 while the corrected estimate of $X_k$ is available at the output of decoder 280. In this manner, the estimate of each of the values of $X_k$, which comprise the stream of message information binary digits, can be iteratively solved using the most current estimate of $X_k$, and the initial estimate of the associated error control information, $Y_k$. Delay 290 can be of any type. The only requirement of delay 290 is that it possesses sufficient memory to retain the estimates of $Y_k$ and make these available to switch 251 within the system timing constraints.

Decoders 261 and 281 desirably perform the identical operations on successive estimates of $X_k$ using the initial estimate of $Y_k$. In a manner similar to that for decoders 260 and 280, decoder 261 estimates the value of $X_k$ using $Y_{k,1}$, and decoder 281 estimates the value of $X_k$ using $Y_{k,2}$. Thus, decoders 261 and 281 can be of the same type as decoders 260 and 280. Additionally, since pseudorandom deinterleaver 271 desirably performs an identical function as pseudorandom deinterleaver 270, these two devices can also be of a similar type.

In accordance with a preferred embodiment of the invention, an ensemble of decoders such as 260 and 280, switch 250, pseudorandom deinterleaver 270, and delay 290 comprise the apparatus by which a single estimation of the value of $X_k$, using the available error control information $Y_{1,k}$ and $Y_{2,k}$, is performed. In a preferred embodiment, these estimations are performed twice, as shown in FIG. 4. However, the method and apparatus of the present invention is not limited to performing estimations a specific number of times as more estimations can be performed under exceptionally noisy circumstances.

In FIG. 4, the two estimations of $X_k$ are shown as operating in a pipelined manner. In a preferred embodiment, this is done to minimize the latency in the streams of binary digits caused by the processing time needed to execute the BCJR algorithm in decoders 260 and 280. However, in applications where the binary digits are transmitted at a lower rate, or transmitted intermittently, the output of decoder 280 and delay 290 can be looped back to feed decoder 260. In this manner, the processing resources needed to perform successive estimations can be minimized.

After estimating the correct value $X_k$ it is desirable to estimate the value of $Y_k$. Through the correct estimation of $Y_k$, and the correct estimation of $X_k$, the symbol can be correctly estimated by way of symbol estimator 360. Estimator 400, in FIG. 4, performs the task of correctly estimating the error control binary digits, $Y_k$, using the original estimates of the error control binary digits from the corrected values of $X_k$. The BCJR algorithm is used to estimate the values of $Y_{1,k}$ and $Y_{2,k}$ using $X_k$ so that a soft decision can be made by symbol estimator 360. The output of decoder is coupled to the input of switch 350, pseudorandom interleaver 310, and decoder 320.

The output of delay 291 is fed to demultiplexer 300. The role of demultiplexer 300 is to separate the stream of error control binary digits, $Y_k$, into streams consisting of $Y_{1,k}$ and $Y_{2,k}$. The two outputs of demultiplexer 300 are then fed to decoders 320 and 330. In decoder 320, binary digits $X_k$ from the output of decoder 281 are combined with the stream of error control binary digits from demultiplexer 300. Decoder 320 executes the BCJR algorithm as in decoders 260, 280, 261, and 281 using values of $X_k$ and $Y_{1,k}$. Decoder 330 executes the same BCJR algorithm using the values of $X_k$ and $Y_{2,k}$ in a similar manner. Decoders 320 and 330 can be of the same type as decoders 260, 280, 261, and 281 with the exception that decoder 320 has been specifically adapted to solve equations 1 through 8 for $Y_{1,k}$. Additionally, decoder 330 has been specifically adapted to solve equations 1 through 8 for $Y_{2,k}$.

The stream of estimated values of $X_k$ from decoder 218 are also reinterleaved by pseudorandom interleaver 310 in order to be combined with the appropriate error control binary digits, $Y_{2,k}$, from demultiplexer 300. Pseudorandom interleaver 310 functions to rearrange the estimated values of $X_k$ so that each can arrive at decoder 330 concurrent with the associated error control binary digits, $Y_{2,k}$.

The outputs of each of the decoders 320 and 330 are then switched between $Y_{1,k}$ and $Y_{2,k}$ by switch 340 in order to present these to the input of switch 350. Switch 350 is then switched to present an estimated value for $X_k$, from decoder 281, followed by either a value for $Y_{1,k}$ or $Y_{2,k}$ to symbol estimator 360. Symbol estimator 360 uses both the corrected estimates of error control binary digits and information binary digits to improve the symbol estimates which, in turn, corrects the other bits which comprise the received symbol. Symbol estimator 360 combines the output of switch 350, the stream of binary digits from demodulator/data estimator 220. Estimator 360 performs a soft decision to assign binary digits to the symbol based on the above information. Symbol estimators that perform symbol to binary digit assignments based on soft decisions are known to those of skill in the art.

Figure 5:
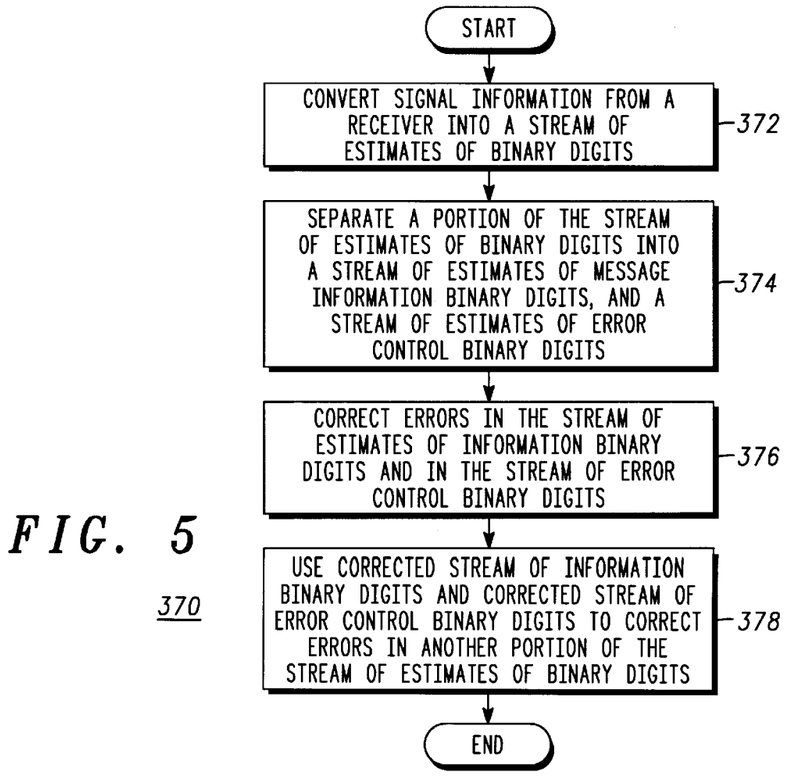
FIG. 5 illustrates a method for correcting errors in a stream of binary digits to which an error control code has been applied in accordance with the preferred embodiment.

FIG. 5 illustrates a method 370 for correcting errors in a stream of binary digits to which an error control code has been applied in accordance with a preferred embodiment. Step 372 converts signal information from a receiver into a stream of estimates of binary digits. Step 374 separates a portion of the stream of estimates of binary digits into a stream of estimates of information binary digits and a stream of estimates of error control binary digits. Step 376 corrects errors in the stream of estimates of information binary digits and in the stream of estimates of error control binary digits. Step 378 uses the corrected stream of information binary digits and the corrected stream of error control binary digits to correct errors in another portion of the stream of estimates of binary digits.

Figure 6:
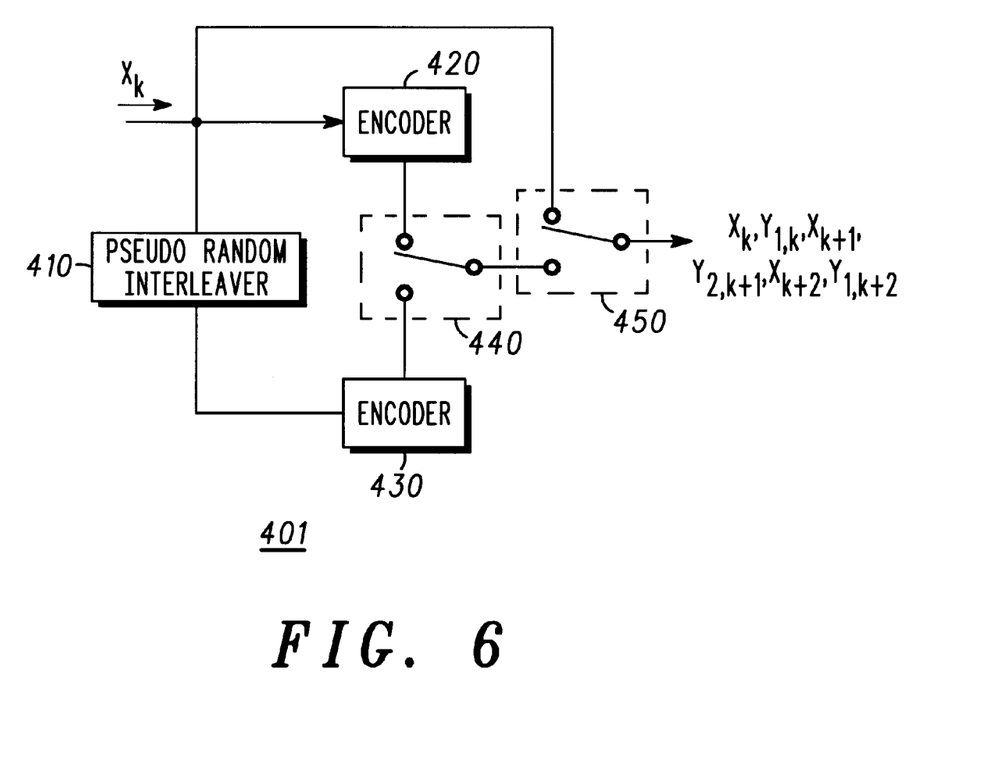
FIG. 6 illustrates an apparatus for estimating $Y_k$ in accordance with an alternate embodiment of the invention.

FIG. 6 illustrates an apparatus for estimating $Y_k$ 401 in accordance with an alternate embodiment of the invention. In this embodiment, the estimated values of $X_k$ are used. Each of the elements shown in FIG. 6 are used in lieu of the elements of estimator 400. In FIG. 6, the estimated values for $X_k$ from decoder 281 are fed to encoder 420 and to pseudorandom interleaver 410. The output of pseudorandom interleaver 410 is fed to recursive convolutional encoder 430. The outputs of recursive convolutional encoder 420 and 430 are then input to switches 440 and 450. The output of switch 450 is then combined with the estimates of streams of higher order binary digits from demodulator/data estimator 220 in symbol estimator 360 shown in FIG. 4. Encoders 420 and 430 can be of the same type as encoders 130 and 150 in FIG. 1. The only difference is that in FIG. 6, estimates of information binary digits are input to decoders 420 and 430 rather than inputting the information binary digits themselves as is the case with decoders 130 and 150 in FIG. 1.

The apparatus for decoding binary information using restricted coded modulation and parallel concatenated convolutional codes described herein allows the reception of signals in a high noise environment in a highly bandwidth-efficient manner. This results in the capability to build low cost equipment that does not require a high power transmitter at the transmitter end of the system to be effective.

The method and apparatus of the present invention combines the technique of restricted coded modulation with a parallel concatenated convolutional code to encode information binary digits while consuming only a small portion of the channel bandwidth. In this invention, the assignment of binary digits to symbols is made in such a manner that the most likely errors, adjacent symbol errors, correspond to errors in a specific subset of the binary digits which comprise the symbol. Thus, the most likely errors in the symbol correspond errors in a specific subset of the binary digits which comprise the symbol. A powerful parallel concatenated convolutional code is then applied to the specific subset of binary digits to produce an encoded stream of binary digits. The encoded stream of binary digits is then combined with the unencoded binary digits of the symbol and transmitted along the communication channel. At the receiving end, the encoded binary digits are then decoded to correct any noise-induced adjacent symbol errors which may corrupt either the information or error control binary digits. The corrected information is then used to correct errors in the unencoded binary digits which comprise the symbol.

Accordingly, it is intended by the appended claims to cover all modifications of the method and apparatus of the present invention that fall within the true spirit and scope of the invention.

What is claimed is:

1. A method for applying an error control code to a stream of binary digits, the method comprising the following steps:

a) converting the stream of binary digits to a plurality of unencoded streams of binary digits using restricted coded modulation;

b) encoding one of the plurality of unencoded streams of binary digits by way of a parallel concatenated convolutional encoder resulting in a stream of parallel concatenated convolutionally encoded binary digits;

c) combining the stream of parallel concatenated convolutionally encoded binary digits with the one of the plurality of unencoded streams of binary digits; and d) combining the one stream of parallel concatenated convolutionally encoded binary digits and the one of the plurality of unencoded streams of binary digits with the plurality of unencoded streams of binary digits resulting in a combined stream of binary digits.

2. The method as recited in claim 1, wherein step d) further comprises the step of converting the combined stream of binary digits to symbols.

3. An electronic system, wherein the electronic system applies an error control code to a stream of binary digits, the electronic system comprising:

a converter which accepts the stream of binary digits and converts the stream of binary digits to a plurality of unencoded streams of binary digits using restricted coded modulation;

an encoder which applies a parallel concatenated convolutional code to one of the plurality of unencoded streams of binary digits resulting in one stream of parallel concatenated convolutionally encoded binary digits;

a data switch which combines the one stream of parallel concatenated convolutionally encoded binary digits with the one of the plurality of unencoded streams of binary digits; and a modulator which accepts as an input the one stream of parallel concatenated convolutionally encoded binary digits and combines the one stream of parallel concatenated convolutionally encoded binary digits and the one of the plurality of unencoded streams of binary digits with the plurality of unencoded streams of binary digits.

4. An electronic system as recited in claim 3, wherein the electronic system further comprises a transmitter whose input is coupled to an output of the modulator.

5. An electronic system as recited in claim 3, wherein the electronic system is a satellite space vehicle.

6. An electronic system as recited in claim 3, wherein the electronic system is a communication unit.

7. An electronic system as recited in claim 3, wherein the electronic system is a computer unit.

8. A method for correcting errors in a stream of binary digits to which an error control code has been applied, the method comprising the following steps:

a) converting signal information which has been modulated using restricted coded modulation from a receiver into a stream of estimates of binary digits;

b) separating a portion of the stream of estimates of binary digits into a stream of estimates of information binary digits and a stream of estimates of error control binary digits;

c) correcting first errors in the stream of estimates of information binary digits and in the stream of estimates of error control binary digits resulting in a corrected stream of information binary digits and a corrected stream of error control binary digits; and d) using the corrected stream of information binary digits and the corrected stream of error control binary digits to correct second errors in another portion of the stream of estimates of binary digits.

9. The method of claim 8, wherein step (c) further comprises the step of inserting the corrected stream of information binary digits into a parallel concatenated convolutional encoder.

10. An electronic system, wherein the electronic system corrects errors in a stream of binary digits to which an error control code has been applied, the system comprising:

a converter which accepts signal information from a receiver and converts the signal information to a stream of estimates of binary digits, wherein said signal information has been modulated using restricted coded modulation;

a demultiplexer/data estimator which separates a portion of the stream of estimates of binary digits into a stream of estimates of information binary digits and a stream of estimates of error control binary digits;

a decoder which corrects first errors in the stream of estimates of information binary digits and the stream of estimates of error control binary digits resulting in a corrected stream of information binary digits and a corrected stream of error control binary digits; and an estimator that uses the corrected stream of information binary digits and the corrected stream of error control binary digits to correct second errors in another portion of the stream of estimates of binary digits.

11. An electronic system as recited in claim 10, wherein the receiver is a radio frequency receiver.

12. An electronic system as recited in claim 10, wherein the electronic system is a satellite space vehicle.

13. An electronic system as recited in claim 10, wherein the electronic system is a communication unit.

14. An electronic system as recited in claim 10, wherein the electronic system is a computer unit.

* * * * *